United States Patent
Eckberg et al.

(10) Patent No.: US 8,941,993 B2
(45) Date of Patent: Jan. 27, 2015

(54) HEAT EXCHANGER DOOR FOR AN ELECTRONICS RACK

(75) Inventors: Eric A. Eckberg, Rochester, MN (US); Howard V. Mahaney, Jr., Cedar Park, TX (US); William M. Megarity, Roxboro, NC (US); Roger R. Schmidt, Poughkeepsie, NY (US); Tejas Shah, Austin, TX (US); Scott A. Shurson, Mantorville, MN (US)

(73) Assignee: Lenovo Enterprise Solutions (Singapore) Pte. Ltd., New Tech Park (SG)

( * ) Notice: Subject to any disclaimer, the term of this patent is extended or adjusted under 35 U.S.C. 154(b) by 396 days.

(21) Appl. No.: 13/443,070

(22) Filed: Apr. 10, 2012

(65) Prior Publication Data
US 2013/0264026 A1 Oct. 10, 2013

(51) Int. Cl.
- *H05K 7/20* (2006.01)
- *G06F 1/20* (2006.01)

(52) U.S. Cl.
USPC ...... 361/701; 361/679.53; 361/690; 361/696; 361/704; 70/208; 165/67; 165/104.33; 292/113; 312/223.2; 312/236

(58) Field of Classification Search
USPC .......... 361/679.48, 679.53–679.54, 690, 696, 361/701, 704; 70/208, DIG. 31; 165/67, 165/104.33, 185; 292/113, DIG. 31; 312/223.2, 236
See application file for complete search history.

(56) References Cited

U.S. PATENT DOCUMENTS

| | | | |
|---|---|---|---|
| 2,278,086 A | 3/1942 | Lea | |
| 4,011,905 A | 3/1977 | Millard | |
| 5,187,950 A | 2/1993 | Weldon | |
| 5,467,250 A | 11/1995 | Howard et al. | |
| 5,638,709 A * | 6/1997 | Clavin | 70/208 |
| 5,898,995 A | 5/1999 | Ghodbane | |
| 6,164,369 A | 12/2000 | Stoller | |
| 6,462,944 B1 | 10/2002 | Lin | |
| 6,535,382 B2 | 3/2003 | Bishop et al. | |
| 6,606,889 B1 * | 8/2003 | Tweedy | 70/208 |
| 6,760,221 B2 | 7/2004 | Goth et al. | |
| 6,775,137 B2 | 8/2004 | Chu et al. | |
| 6,819,563 B1 | 11/2004 | Chu et al. | |
| 6,913,297 B2 * | 7/2005 | Jackson et al. | 292/196 |
| 7,074,123 B2 | 7/2006 | Bettridge et al. | |
| 7,086,247 B2 | 8/2006 | Campbell et al. | |
| 7,311,339 B2 * | 12/2007 | Lau et al. | 292/128 |

(Continued)

OTHER PUBLICATIONS

C2 Compression Latch catalog, Southco, No Date, 1 page.*
C2 Lever Latch Assembly with Locking Raised Trigger, Dwg No. J-C2-32-3, Rev. Q, Jul. 23, 2013, 1 page.*
C2 Lever Latch Assembly with Locking Raised Trigger, Dwg. No. J-C2-33-2, Rev. O, Jul. 24, 2013, 1 page.*

(Continued)

*Primary Examiner* — Robert J Hoffberg

(57) ABSTRACT

An air-cooling apparatus is provided which includes a heat exchanger door and a catch bracket. The door is hingedly mounted to the air inlet or outlet side of an electronics rack, and includes: a door frame spanning at least a portion of the air inlet or outlet side of the rack, wherein the frame includes an airflow opening which facilitates airflow through the rack; an air-to-coolant heat exchanger supported by the door frame and disposed so that airflow through the airflow opening passes thereacross; and a door latch mechanism to selectively latch the heat exchanger door to the rack. The catch bracket is attached to the rack and sized to extend from the rack into the heat exchanger door through a catch opening, and the door latch mechanism is configured and mounted within the heat exchanger door to physically engage the catch bracket within the heat exchanger door.

18 Claims, 13 Drawing Sheets

(56) References Cited

U.S. PATENT DOCUMENTS

| | | |
|---|---|---|
| 7,385,810 B2 | 6/2008 | Chu et al. |
| 7,403,391 B2 | 7/2008 | Germagian et al. |
| 7,646,603 B2 | 1/2010 | Bard et al. |
| 7,676,909 B2 | 3/2010 | MacKenzie et al. |
| 7,830,657 B2 | 11/2010 | Chu et al. |
| 7,963,118 B2 | 6/2011 | Porter et al. |
| 8,113,009 B2 | 2/2012 | Kuriyama et al. |
| 8,453,713 B2 | 6/2013 | Delia et al. |
| 8,693,198 B2* | 4/2014 | Eckberg et al. ............... 361/701 |
| 8,693,199 B2* | 4/2014 | Eckberg et al. ............... 361/701 |
| 2004/0177948 A1 | 9/2004 | Cho et al. |
| 2005/0231913 A1 | 10/2005 | Malone et al. |
| 2005/0243514 A1 | 11/2005 | Malone et al. |
| 2006/0141921 A1 | 6/2006 | Turek et al. |
| 2006/0232945 A1 | 10/2006 | Chu et al. |
| 2008/0068798 A1 | 3/2008 | Hendrix et al. |
| 2008/0112128 A1 | 5/2008 | Holland |
| 2012/0300398 A1 | 11/2012 | Eckberg et al. |
| 2013/0021746 A1 | 1/2013 | Campbell et al. |
| 2013/0263450 A1* | 10/2013 | Eckberg et al. ............ 29/890.03 |
| 2013/0264024 A1 | 10/2013 | Eckberg et al. |
| 2013/0264027 A1 | 10/2013 | Eckberg et al. |
| 2013/0264030 A1 | 10/2013 | Eckberg et al. |
| 2013/0265719 A1 | 10/2013 | Eckberg et al. |
| 2013/0328328 A1* | 12/2013 | Leslie et al. .................. 292/195 |
| 2013/0328331 A1* | 12/2013 | Wollacott et al. ............. 292/202 |

OTHER PUBLICATIONS

"RackCooler—A Cool Solution for X-Treme Density Rack Enclosure Systems", Liebert Corporation, Product Brochure, 8 pages (2001).

Teague, Paul E. "One Cool Machine", Design News for Mechanical and Design Engineers, Internet Article, 6 pages (Feb. 7, 2005).

7,385,810 Chu et al., Office Action for U.S. Appl. No. 11/108,306 (U.S. Patent No. 7,385,810 B2), dated Sep. 20, 2007.

Chu et al., Notice of Allowance for U.S. Appl. No. 11/108,306 (U.S. Patent No. 7,385,810 B2), dated Apr. 14, 2008.

Chu et al., Notice of Allowance for U.S. Appl. No. 12/131,301 (U.S. Patent No. 7,830,657 B2), dated Jul. 21, 2010.

Porter et al., Office Action for U.S. Appl. No. 11/860,634 (U.S. Patent No. 7,963,118 B2), dated Oct. 8, 2010.

Porter et al., Notice of Allowance for U.S. Appl. No. 11/860,634 (U.S. Patent No. 7,963,118 B2), dated Feb. 14, 2011.

Liebert (R) Corporation, "RackCooler (TM)—A Cool Solution for X-Treme Density Rack Enclosure Systems", Product Brochure, 8 pages (2001).

Eckberg et al., Notice of Allowance for U.S. Appl. No. 13/443,084, filed Apr. 10, 2012 (U.S. Patent Publication No. 2013/0264030 A1), dated Nov. 26, 2013 (24 pages).

Eckberg et al., Notice of Allowance for U.S. Serial No. 775,610, filed Feb. 25, 2013 (U.S. Patent Publication No. 2013/0265719 A1), dated Nov. 27, 2013 (23 pages).

* cited by examiner

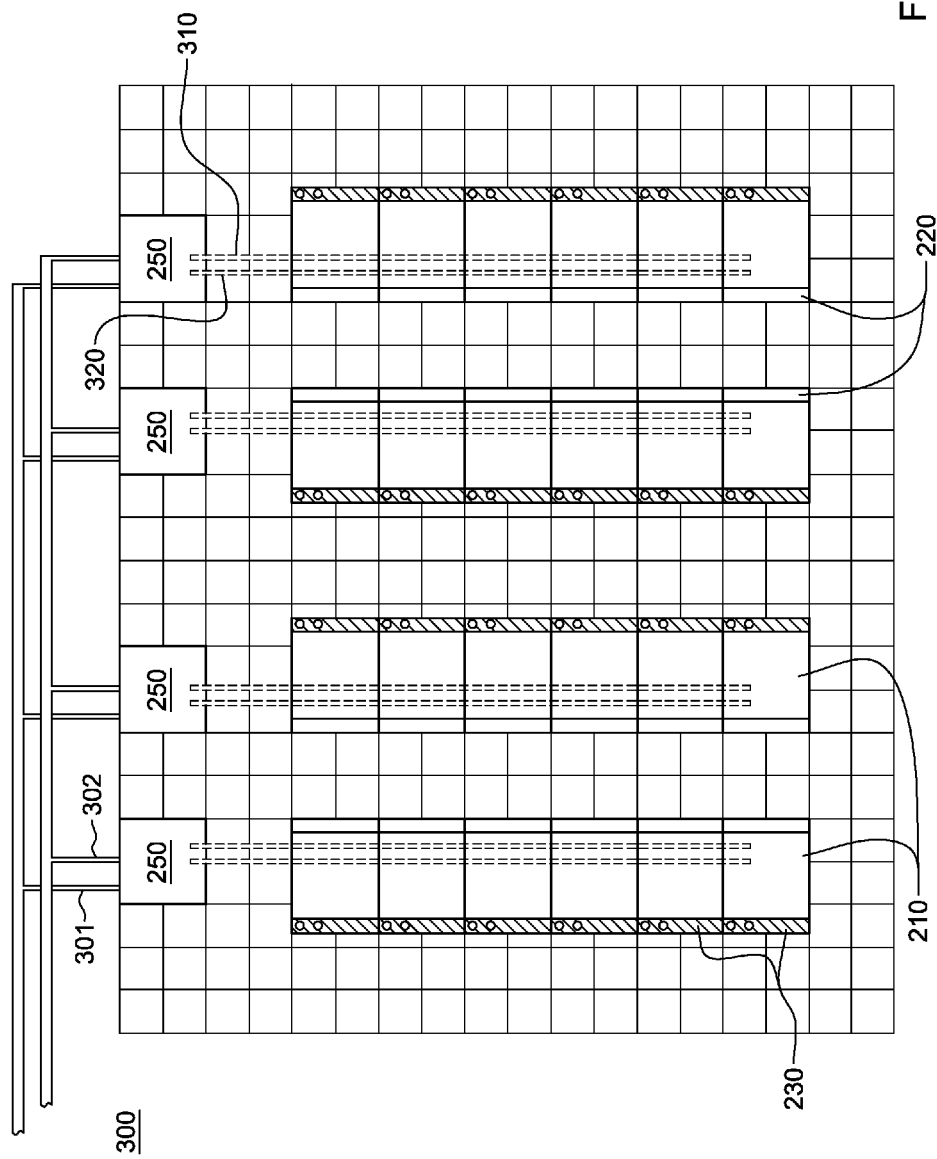

United States Patent US 8,941,993 B2

HEAT EXCHANGER DOOR FOR AN ELECTRONICS RACK

BACKGROUND

The power dissipation of integrated circuit chips, and the modules containing the chips, continues to increase in order to achieve increases in processor performance. This trend poses a cooling challenge at both module and system levels. Increased airflow rates are needed to effectively cool high-powered modules, and to limit the temperature of the air that is exhausted into the computer center.

In many large server applications, processors, along with their associated electronics (e.g., memory, disk drives, power supplies, etc.), are packaged in removable drawer configurations stacked within a rack or frame. In other cases, the electronics may be in fixed locations within the rack or frame. Typically, the components are cooled by air moving in parallel airflow paths, usually front-to-back, impelled by one or more air-moving devices (e.g., fans or blowers). In some cases, it may be possible to handle increased power dissipation within a single drawer by providing greater airflow, through the use of a more powerful air-moving device, or by increasing the rotational speed (i.e., RPMs) of an existing air-moving device.

The sensible heat load carried by the air exiting the rack is stressing the capability of the room air-conditioning to effectively handle the load. This is especially true for large installations with "server farms", or large banks of computer racks close together. In such installations, liquid-cooling (e.g., water-cooling) is an attractive technology to manage the higher heat fluxes. The liquid absorbs the heat dissipated by the components/modules in an efficient manner. Typically, the heat is ultimately transferred from the liquid to an outside environment.

BRIEF SUMMARY

The shortcomings of the prior art are overcome and additional advantages are provided through the provision of an apparatus, which includes: a heat exchanger door configured to hingedly couple to an electronics rack and be disposed at one of an air inlet side or an air outlet side of the electronics rack, wherein air moves through the electronics rack from the air inlet side to the air outlet side thereof; and a catch bracket configured to attach to the electronics rack and sized to extend from the electronics rack into the heat exchanger door through a catch opening in the heat exchanger door. The heat exchanger door includes: a door frame sized and configured to span at least a portion of the air inlet side or the air outlet side of the electronics rack, and which includes an airflow opening which facilitates the ingress or egress of airflow through the electronics rack with the heat exchanger door mounted to the electronics rack; and air-to-coolant heat exchanger supported by the door frame and disposed so that airflow through the airflow opening passes across the air-to-coolant heat exchanger, the air-to-coolant heat exchanger being configured to extract heat from the airflow passing thereacross; and a door latch mechanism to selectively latch the heat exchanger door to the electronics rack. The door latch mechanism is configured to, and mounted within the heat exchanger door to, selectively, physically engage the catch bracket within the heat exchanger door, and thereby latch the heat exchanger door to the electronics rack.

In another aspect, an assembly is provided which includes an electronics rack, a heat exchanger door hingedly coupled to the electronics rack at an air inlet side or an air outlet side of the electronics rack, and a catch bracket attached to the electronics rack and extending from the electronics rack into the heat exchanger door through a catch opening in the heat exchanger door to facilitate latching of the heat exchanger door to the electronics rack. Air moves through the electronics rack from the air inlet side to the air outlet side of the electronics rack, and the heat exchanger door includes a door frame, an air-to-coolant heat exchanger, and a door latch mechanism. The door frame is sized and configured to span at least a portion of the air inlet side or the air outlet side of the electronics rack, and includes an airflow opening, which facilitates the ingress or egress of airflow through the electronics rack. The air-to-coolant heat exchanger is supported by the door frame and disposed so that airflow through the airflow opening passes across the air-to-coolant heat exchanger, with the air-to-coolant heat exchanger being configured to extract heat from airflow passing thereacross. The door latch mechanism is configured to selectively latch the heat exchanger door to the electronics rack and is mounted within the heat exchanger door to selectively, physically engage the catch bracket within the heat exchanger door, and thereby latch the heat exchanger door to the electronics rack.

In a further aspect, a method is provided which includes: providing a heat exchanger door configured to hingedly couple to an electronics rack and be disposed at one of an air inlet side or an air outlet side of the electronics rack, wherein air moves through the electronics rack from the air inlet side to the air outlet side, and wherein the heat exchanger door comprises: a door frame sized and configured to span at least a portion of the air inlet side or the air outlet side of the electronics rack, the door frame comprising an airflow opening, the airflow opening facilitating the ingress or egress of airflow through the electronics rack with the heat exchanger door mounted thereto; and air-to-coolant heat exchanger supported by the door frame and disposed so that airflow through the airflow opening passes across the air-to-coolant heat exchanger, the air-to-coolant heat exchanger configured to extract heat from the airflow passing thereacross; a door latch mechanism residing entirely within the heat exchanger door to selectively latch the heat exchanger door to the electronics rack; and providing a catch bracket configured to attach to the electronics rack and sized to extend from the electronics rack into the heat exchanger door through a catch opening in the heat exchanger door to facilitate latching the heat exchanger door to the electronics rack, wherein the door latch mechanism is configured to, and mounted within the heat exchanger door to, selectively, physically engage the catch bracket within the heat exchanger door, and thereby latch the heat exchanger door to the electronics rack.

Additional features and advantages are realized through the techniques of the present invention. Other embodiments and aspects of the invention are described in detail herein and are considered a part of the claimed invention.

BRIEF DESCRIPTION OF THE SEVERAL VIEWS OF THE DRAWINGS

One or more aspects of the present invention are particularly pointed out and distinctly claimed as examples in the claims at the conclusion of the specification. The foregoing and other objects, features, and advantages of the invention are apparent from the following detailed description taken in conjunction with the accompanying drawings in which:

FIG. 3 depicts one embodiment of a data center layout comprising multiple coolant distribution units providing coolant to a plurality of electronics racks with air-cooling apparatuses mounted to at least one of the air inlet sides or air outlet sides thereof, in accordance with one or more aspects of the present invention;

DETAILED DESCRIPTION

Figure 1:
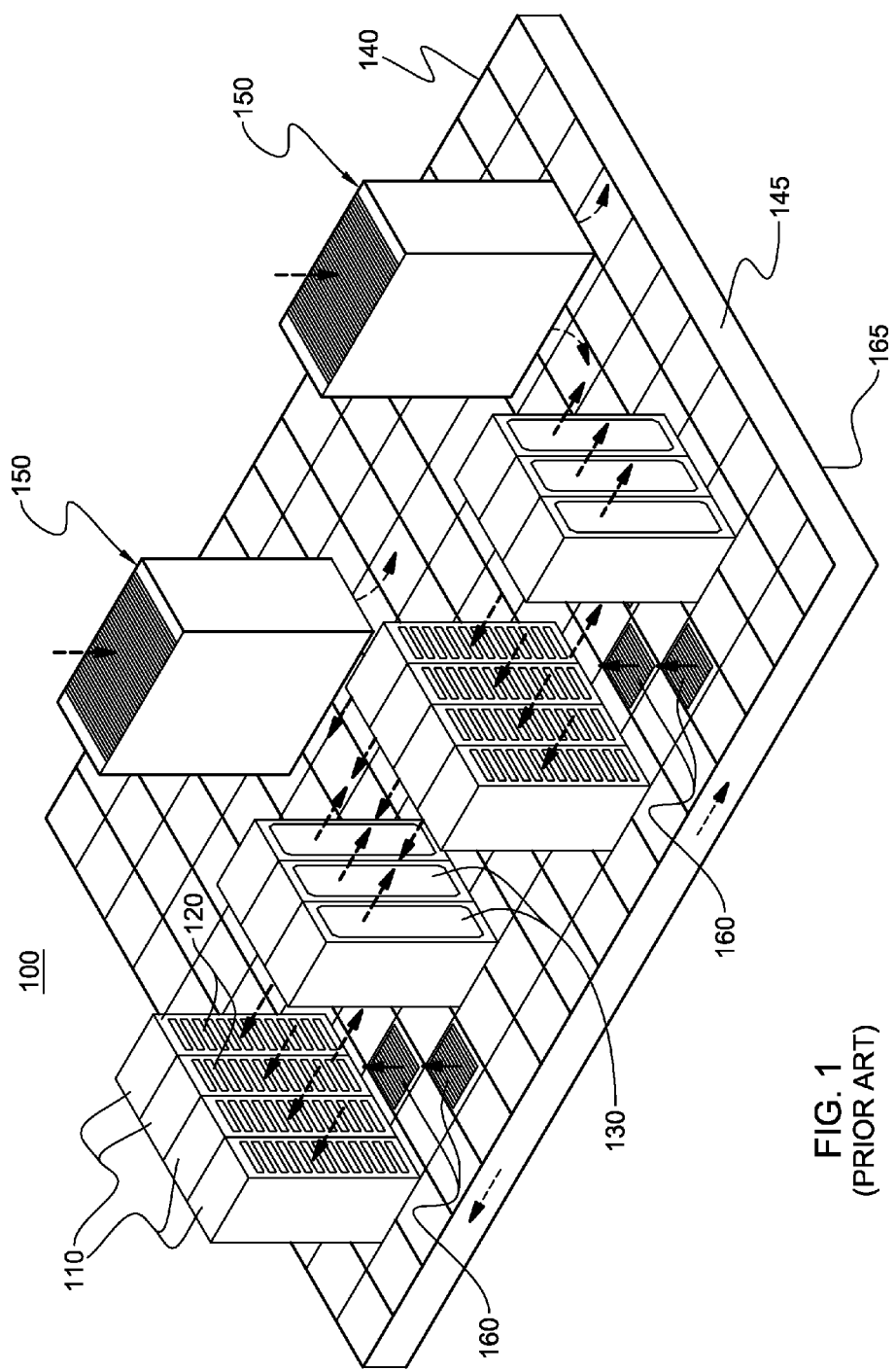
FIG. 1 depicts one embodiment of a raised floor layout of a computer installation capable of being retrofitted with one or more air-cooling apparatuses, in accordance with one or more aspects of the present invention.

As used herein, the terms "electronics rack", "rack unit", and "rack" are used interchangeably, and unless otherwise specified, include any housing, frame, support structure, compartment, blade server system, etc., having one or more heat generating components of a computer system or electronic system, and may be, for example, a stand-alone computer processor having high, mid or low end processing capability. In one embodiment, an electronics rack may comprise a portion of an electronic system, a single electronic system, or multiple electronic systems, for example, in one or more sub-housings, blades, books, drawers, nodes, compartments, etc., having one or more heat-generating electronic components disposed therein. An electronic system within an electronics rack may be movable or fixed relative to the electronics rack, with the rack-mounted electronic drawers of a multi-drawer rack unit and blades of a blade center system being two examples of systems (or subsystems) of an electronics rack to be cooled.

Further, as used herein, "air-to-coolant heat exchanger" means any heat exchange mechanism characterized as described herein through which coolant can circulate; and includes, one or more discrete air-to-coolant heat exchangers coupled either in series or in parallel. An air-to-coolant heat exchanger may comprise, for example, one or more coolant flow paths, formed of thermally conductive tubings (such as copper or other tubing) in thermal or mechanical contact with a plurality of air-cooled cooling fins (such as aluminum or other fins). Unless otherwise specified, size, configuration and construction of the air-to-coolant heat exchanger can vary without departing from the scope of the invention disclosed herein. A "coolant-to-liquid heat exchanger" may comprise, for example, two or more coolant flow paths, formed of thermally conductive tubings (such as copper or other tubing) in thermal or mechanical contact with each other to facilitate conduction of heat therebetween. Size, configuration and construction of the coolant-to-liquid heat exchanger can vary without departing from the scope of the invention disclosed herein. Further, as used herein, "data center" refers to a computer installation containing one or more electronics racks, and as a specific example, a data center may include one or more rows of rack-mounted computing units, such as server units.

One example of facility coolant and system coolant is water. However, the concepts disclosed herein are readily adapted to use with other types of coolant on the facility side and/or on the system side. For example, one or more of the coolants may comprise a water-glycol mixture, a brine, a fluorocarbon liquid, a liquid metal, or other similar coolant, or a refrigerant, while still maintaining the advantages and unique features of the present invention. Further, the term "coolant" refers to any liquid or gas, or combination thereof, used to remove heat, in accordance with the structures and concepts disclosed herein.

Reference is made below to the drawings, which are not drawn to scale to facilitate an understanding of the invention, wherein the same reference numbers used throughout different figures designate the same or similar components.

As shown in FIG. 1, in a raised floor layout of an air cooled computer installation or data center 100, multiple electronics racks 110 may be disposed in one or more rows. A computer installation such as depicted in FIG. 1 may house several hundred, or even several thousand processors. In the arrangement of FIG. 1, chilled air enters the computer room via floor vents from a supply air plenum 145 defined between a raised floor 140 and a base or sub-floor 165 of the room. Cooled air is taken in through louvered covers at the front, or air inlet sides 120, of the electronics racks and expelled through the back, or air outlet sides 130, of the electronics racks. Each electronics rack 110 may have one or more air-moving devices (e.g., fans or blowers) to provide forced inlet-to-outlet airflow to cool the electronic components within the rack. Supply air plenum 145 provides conditioned and cooled air to the air-inlet sides of the electronics racks via perforated floor tiles 160 disposed (in one embodiment) in a "cold" air aisle of the data center. The conditioned and cooled air is supplied to plenum 145 by one or more air-conditioning units 150, which may also be disposed within data center 100. Room air is taken into each air-conditioning unit 150 near an upper portion thereof. In the depicted embodiment, this room air comprises in part exhausted air from the "hot" air aisles of the data center defined by opposing air outlet sides 130 of the electronics racks 110.

Due to ever increasing airflow requirements through electronics racks, and the limits of air distribution within the typical computer room installation, recirculation problems within the room may occur. Recirculation can occur because the conditioned air supplied through the floor tiles may only be a fraction of the airflow rate forced through the electronics racks by the air moving devices disposed within the racks. This can be due, for example, to limitations on the tile sizes (or diffuser flow rates). The remaining fraction of the supply of inlet side air may be made up by ambient room air through recirculation, for example, from the air outlet side of the rack unit to the air inlet side. This recirculating flow is often very complex in nature, and can lead to significantly higher rack inlet temperatures than might be expected.

Recirculation of hot exhaust air from the hot aisle of the computer room installation to the cold aisle can be detrimental to the performance and reliability of the computer system(s) or electronic system(s) within the rack(s). Data center equipment is typically designed to operate with rack air inlet temperatures in the 15-35° C. range. For a raised floor layout such as depicted in FIG. 1, however, temperatures can range from 15-20° C. at the lower portion of the rack, close to the cool air floor vents, to as much as 32-42° C. at the upper portion of the electronics rack, where hot air can form a self-sustaining recirculation loop. Since the allowable rack heat load is limited by the rack inlet air temperature at the "hot" part, this temperature distribution correlates to an inefficient utilization of available air conditioning capability. Computer installation equipment almost always represents a high capital investment to the customer. Thus, it is of significant importance, from a product reliability and performance view point, and from a customer satisfaction and business perspective, to achieve a substantially uniform temperature across the air inlet side of the rack unit.

Figure 2A:
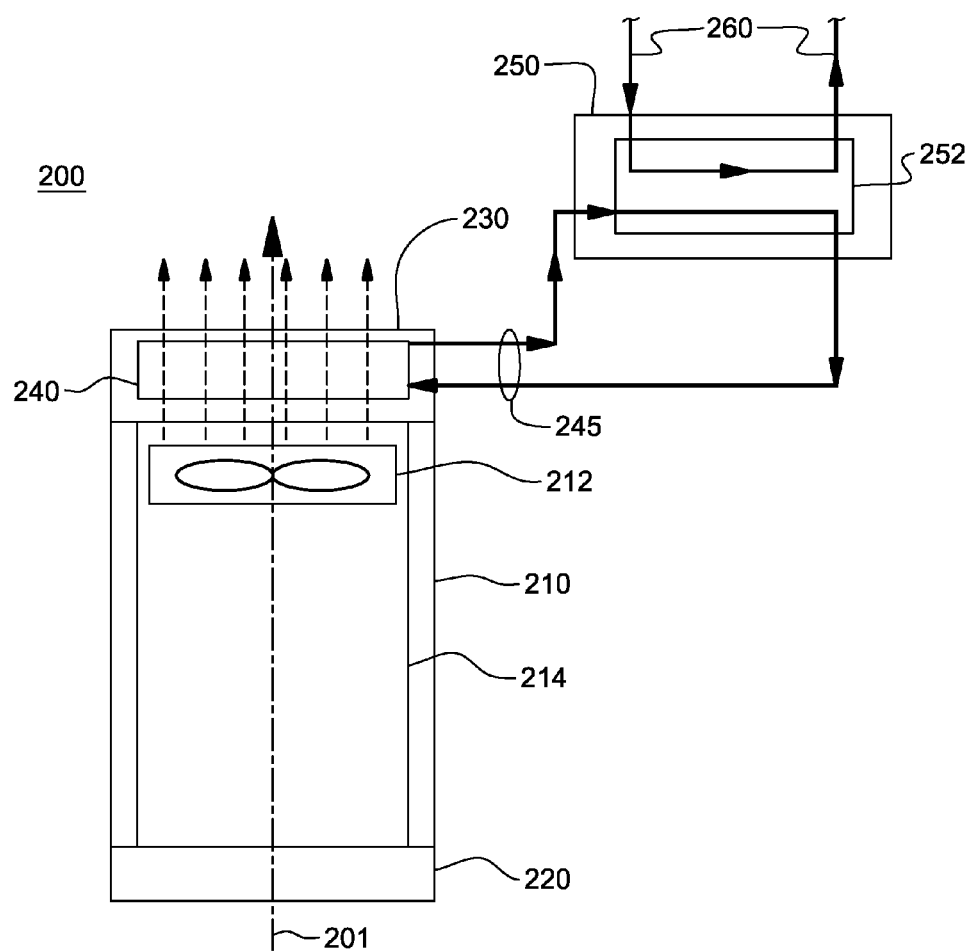
FIG. 2A is a top plan view of one embodiment of an electronics rack with a heat exchanger door mounted to an air outlet side thereof, and with extracted heat being rejected to facility coolant via a coolant distribution unit, in accordance with one or more aspects of the present invention.
Figure 2B:
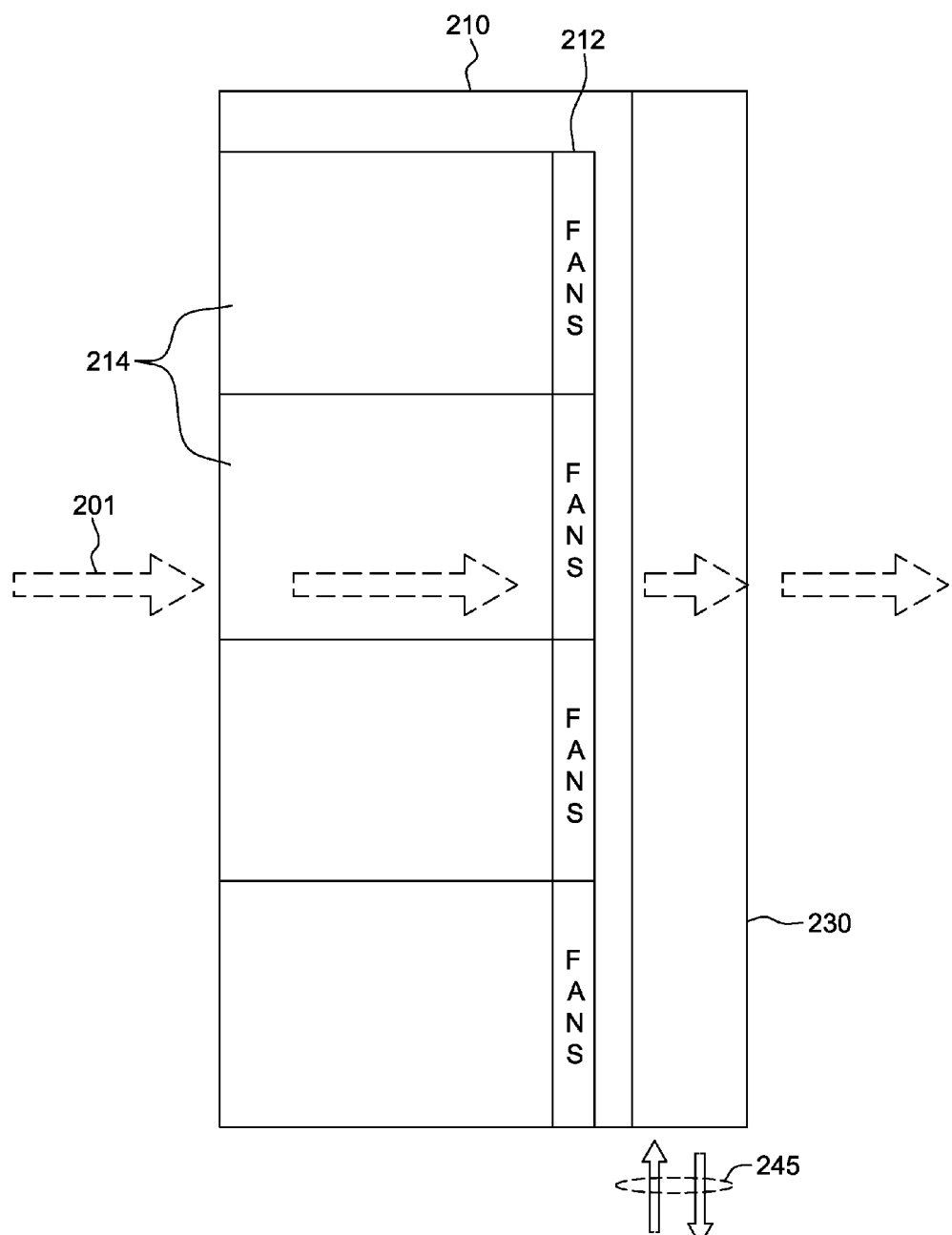
FIG. 2B is a side elevational view of the electronics rack and heat exchanger door of FIG. 2A, in accordance with one or more aspects of the present invention.

Referring collectively to FIGS. 2A & 2B, these figures depict one embodiment of a cooled electronic system, generally denoted 200, which includes an electronics rack 210 having an inlet door 220 and an outlet door 230. The inlet and outlet doors have openings to allow for the ingress and egress of air 201, respectively, through the air inlet side and air outlet side of electronics rack 210. The system further includes at least one air-moving device 212 for moving air across at least one electronic system or component 214 disposed within the electronics rack. Located within outlet door 230 is an air-to-coolant heat exchanger 240 across which the inlet-to-outlet airflow 201 through the electronics rack passes. As shown in FIG. 2A, a system coolant loop 245 couples air-to-coolant heat exchanger 240 to a coolant distribution unit 250. Coolant distribution unit 250 is used to buffer the air-to-coolant heat exchanger from facility coolant in a facility coolant loop 260. Air-to-coolant heat exchanger 240 removes heat from the exhausted inlet-to-outlet airflow 201 through the electronics rack via circulating system coolant, for rejection in coolant distribution unit 250 to facility coolant in facility coolant loop 260, for example, via a coolant-to-liquid heat exchanger 252 disposed therein. By way of example, such a system is described in U.S. Pat. No. 7,385,810 B2, issued Jun. 10, 2008, and entitled "Apparatus and Method for Facilitating Cooling of an Electronics Rack Employing a Heat Exchange Assembly Mounted to an Outlet Door Cover of the Electronics Rack". This cooling apparatus can advantageously reduce heat load on the existing air-conditioning unit(s) within the data center, and facilitates cooling of electronics racks by cooling (in one embodiment) the air egressing from the electronics rack and thus cooling any air recirculating to the air inlet side thereof.

In one implementation, inlet and outlet coolant manifolds of the door-mounted, air-to-coolant heat exchanger are also mounted within the heat exchanger door and are coupled to coolant supply and return lines disposed, for example, beneath a raised floor. Alternatively, overhead system coolant supply and return lines might be provided for the air-to-coolant heat exchangers. In such an embodiment, system coolant would enter and exit the respective coolant inlet and outlet manifolds from the top of the rack door, for example, using flexible coolant supply and return hoses, which may be at least partially looped and sized to facilitate opening and closing of the heat exchanger door. Additionally, structures may be provided at the ends of the hoses to relive stress at the hose ends, which would result from opening or closing of the door.

FIG. 3 is a plan view of one embodiment of a data center, generally denoted 300, with cooled electronic systems comprising door-mounted, air-to-coolant heat exchangers, such as disclosed herein. Data center 300 includes a plurality of rows of electronics racks 210, each of which includes (by way of example only) an inlet door 220 at the air inlet side, and a hinged heat exchanger door 230 at the air outlet side, such as described above in connection with the embodiment of FIGS. 2A & 2B. In this embodiment, each heat exchanger door 230 comprises an air-to-coolant heat exchanger and system coolant inlet and outlet manifolds. Multiple coolant conditioning units 250, which function in part as coolant pumping units, are disposed within the data center (possibly along with one or more air-conditioning units (not shown)). By way of example only, each pumping unit may form a system coolant distribution subsystem with one row of a plurality of electronics racks. Each pumping unit includes a coolant-to-liquid heat exchanger where heat is transferred from a system coolant loop to a facility coolant loop. In operation, chilled facility coolant, such as water, is received via a facility coolant supply line 301, and returned via a facility coolant return line 302. System coolant, such as water, is provided via a system coolant supply manifold 310 extending below the respective row of electronics racks, and is returned via a system coolant return manifold 320 also extending below the respective row of electronics racks. In one embodiment, the system coolant supply and return manifolds 310, 320 are hard-plumbed within the data center, for example, within an air supply plenum of the data center, and may be preconfigured to align under and include branch lines (or hoses) extending towards the electronics racks in a respective row of racks.

Figure 4:
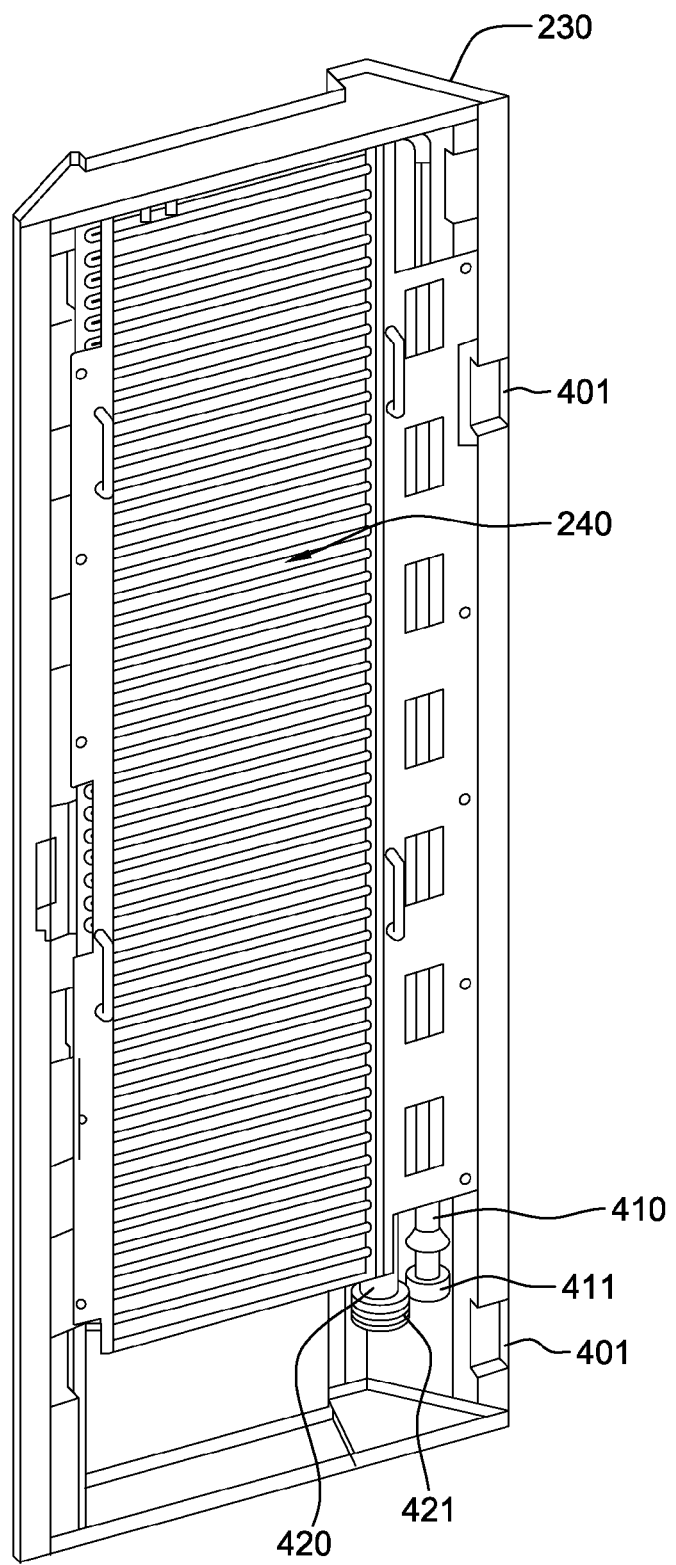
FIG. 4 depicts one implementation of a partially assembled heat exchanger door to be modified, in accordance with one or more aspects of the present invention.

FIG. 4 depicts one version of a heat exchanger door 230 for mounting to the air outlet side of an electronics rack, such as described above in connection with FIGS. 2A-3. This embodiment is described in detail in the above-noted U.S. Pat. No. 7,385,810 B2, and represents one version of an outlet door 230 with an air-to-coolant heat exchanger 240 mounted therein. In this embodiment, a coolant inlet manifold 410 and coolant outlet manifold 420 are provided along a hinge edge 401, which is configured to facilitate hinged mounting of the outlet door to an electronics rack. The coolant inlet and outlet manifolds 410, 420 further include couplings, such as quick connect couplings 411, 421 within the outlet door that are aligned vertically with the coolant inlet and outlet manifolds.

A heat exchanger door, such as depicted in FIG. 4, comprises a cooling device, and replaces (for example) a door of an electronics rack. When incorporated as an outlet door, the heat exchanger door does not provide any direct cooling to the electronic components within the electronics rack, but rather facilitates a reduction in the exhaust air temperature into the data center that may re-circulate to the air inlet side, as well as reduces the heat load to be removed by, for example, the computer room air-conditioning units, and thus, facilitates management of the heat load within the data center. Depending on the implementation, since the temperature of air leaving the electronics rack via a heat exchanger door, such as disclosed herein, can be as cold as or colder than the air entering the electronics rack, usage of the heat exchanger door proposed herein may decrease or even eliminate the need for computer room air-conditioners within the data center.

Advantages of using a heat exchanger door, especially configured, such as disclosed herein, include: the ability to support a much higher power-rack load than can otherwise be supported by traditional air-cooling of the data center alone, which is generally limited to about 10-15 kW/rack for the majority of data centers; eliminates the uncomfortable hot aisle/cold aisle data center floor configuration; eliminates the need for hot aisle and/or cold aisle containment; has significant energy efficiency, that is, as compared with conventional air-cooling, where the typical air-cooled data center must pay for the electrical power used by the blowers and the computer room air-conditioner to force the chilled air under the floor and through the perforated tiles on the floor, to the inlet sides of the electronics racks; utilizes a coolant (such as water) which can result in a 4× to 10× reduction in the cooling cost of a data center; solves the hot spot issues within a data center due to recirculation of exhaust air; is a passive apparatus, requiring no power at the heat exchanger door, and depending on the implementation, requires no fans or control elements which would need to be purchased or replaced if failed; and creates no extra noise within the data center environment.

In view of the significant importance, from a product reliability and performance viewpoint, and from a customer satisfaction and business perspective, to achieve a substantially uniform temperature across the air inlet side of the electronics rack, disclosed herein are various enhancements to the air-cooling apparatus and heat exchanger door configuration described above in connection with FIGS. 2A-4.

There are two primary objectives in designing a heat exchanger door, which are in opposition to each other. These objectives are:
  1. A desire to maximize the amount of heat which can be removed from the air stream. In a simplest form, this can be accomplished by increasing the fin density of the heat exchanger core.
  2. A desire to minimize the air-side pressure drop across the heat exchanger. Since in certain embodiments disclosed herein the heat exchanger door does not have any fans of its own, the fans in the existing electronics rack need to provide enough flow to counteract the impedance of airflow through the electronic system(s) (e.g., server(s)), as well as through the heat exchanger door. For a fixed fan speed, the net airflow rate delivered by the fans will decrease as the impedance of the heat exchanger door increases. This decrease in airflow might trigger thermal sensors to signal for more airflow by increasing the speed (RPMs), power consumption, and thus noise of the fans or other air-moving devices. If the air-moving devices are already at their maximum speed, they are unable to increase speed, and increased component temperatures will result. In its simplest form, decreasing the air-side pressure drop of the heat exchanger door can be accomplished by decreasing the fin density of the heat exchanger core. Therefore, maintaining a very low airflow impedance for the heat exchanger door is important to a commercially successful implementation.

Since power consumption continues to dramatically increase within electronics rack, provided herein are various enhancements to the above-described heat exchanger door, which result, for example, in a 2× improvement in heat removal compared to the outlet door version depicted in FIG. 4, without increasing the air-side pressure drop (impedance). Other objectives in designing a heat exchanger door include: minimizing coolant-side flow rate and pressure drop requirements to minimize pumping costs (operating expenses); minimize weight of the door itself, which must be shipped and installed; minimize costs (that is, minimize capital expense); minimize thickness of the door to decrease the footprint of the electronics rack and heat exchanger door together; and ensure flow uniformity across the parallel flow paths through the heat exchanger door.

To achieve the conflicting goals of maximizing heat removal, while maintaining an acceptably low air-side pressure drop, numerous mechanical structural changes are disclosed herein, so as to maximize the height and width of the heat exchanger core to be as close to the height and width of the heat exchanger door as possible. Advantageously, as the core is made wider, a greater fin surface area is achieved, and there is a decrease in the inlet air velocity entering the heat exchanger door, that is, a larger frontal area for the same volumetric flow rate, and hence, a lower air-side pressure drop is achieved. It is also possible to lower the fin density while maintaining the same surface area, and thereby significantly decrease the air-side pressure drop due to the effects of lower inlet velocity and lower fin pitch. With respect to the heat exchanger core, the following dimensions are significant: height of the heat exchanger door; height of the exchanger core itself; unusable height for the heat exchanger core; the width of the electronics rack, and thus (in one embodiment) the width of the heat exchanger door; the width of the heat exchanger core; and the unusable width of the heat exchanger door for the heat exchanger core. Note that as used herein, the heat exchanger core is assumed to have a width and height substantially corresponding to an airflow opening formed within the door frame or assembly of the heat exchanger door. Thus, maximizing the size of the heat exchanger core corresponds, in one embodiment, to maximizing the size of the airflow opening in the door frame.

By way of example, certain mechanical changes disclosed herein may be made to a heat exchanger door configuration, without changing the overall height and width of the door, which advantageously allow for an increase in the heat exchanger core size. Significantly, an increase in the heat exchanger core width by, for example, 52 mm increases the surface area of the heat exchanger, and allows for a significant decrease in fin density while maintaining the same heat removal. Due to the wider core, the average air velocity entering the heat exchanger door also decreases, since there is a larger frontal area for the same volumetric flow rate to, for example, 88% (wherein pressure drop is typically proportional to velocity squared), and the fin density is much lower, creating much less restriction to the airflow. Coupling these effects allows the air-side pressure drop to be decreased by, for example, 45%, which is a dramatic reduction, achieved without changing the overall height and width of the heat exchanger door.

As noted, disclosed herein are numerous structural modifications and enhancements to a heat exchanger door, which are presented with the goal of maximizing the amount of heat which can be removed from the airstream passing through the electronics rack, while minimizing pressure drop across the heat exchanger door. Also, the heat exchanger door disclosed herein may be employed at either the air inlet side or the air outlet side of the electronics rack, or both, with the discussion presented below assuming that the heat exchanger door is mounted to the air outlet side of an electronics rack, again by way of example only.

Note that the air-to-coolant heat exchanger disclosed herein is advantageously designed to function without added air-moving devices within the electronics rack or within the heat exchanger door. Therefore, air impedance of the heat exchanger door is designed to be a low as possible. This is achieved by controlling various design variables discussed herein, including, for example, the number of coolant tubes, and size of coolant tubes employed in the tube sections of the heat exchanger, and the number, configuration, thickness, and depth in the airflow direction of the fins used in the air-to-coolant heat exchanger. Additionally, the air-to-coolant heat exchanger may be designed to operate (in one embodiment) using, for example, above-dew-point coolant, thus eliminating any chance for condensation to occur, and the need for condensation monitoring and draining devices. The materials and wall thicknesses may be chosen to accommodate the air impedance design. Strict brazing processing definition and control may be employed, along with multiple test points in the build process, for robust, controlled component fabrication. In combination, these considerations contribute to ensure a leak-proof, highly reliable product which meets the design objectives.

Ease of installation may be designed into the air-to-coolant heat exchanger and heat exchanger door disclosed herein through the use of a minimal number of parts, and the use of quick connect couplings. For example, after hingedly mounting the heat exchanger door to the electronics rack, supply and return hoses may be coupled to quick connect couplings. Start-up may be completed by initializing the supply coolant, and attaching a bleed tool to an upper bleed valve, that is, until all air is removed from the piping. For purposes of handling and attaching the heat exchanger door, components are designed for reduced weight where possible. For example, a hybrid aluminum door frame can be employed, with steel support plates where needed for structural integrity, to create and provide a door with a high strength-to-weight ratio. In one embodiment, the heat exchange tube section of the air-to-coolant heat exchanger can comprise small diameter tubes, with minimal diameter manifolds being used, in combination with, for example, lightweight fins (such as aluminum fins), for the heat exchange tube sections to provide the highest possible heat removal area, with the lowest possible weight. Safety considerations may also be taken into account throughout the design. For ease of handling, lifting handles may be provided on, for example, the inner side of the heat exchanger door. Further, to protect fins from damage and to protect the operator or bystander from contacting sharp fins, protective perforated plates may be installed across the inner side and/or outer side of the heat exchanger door.

Generally stated, disclosed herein is an air-cooling apparatus which includes a heat exchanger door configured to hingedly mount to one of an air inlet side or an air outlet side of an electronics rack, wherein air moves through the electronics rack from the air inlet side to the air outlet side thereof. The heat exchanger door includes a door frame sized and configured to span at least a portion of the air inlet side or the air outlet side of the electronics rack, and an air-to-coolant heat exchanger supported by the door frame. The door frame includes an airflow opening which facilitates the ingress or egress of airflow through the electronics rack with the heat exchanger door mounted thereto, and the air-to-coolant heat exchanger is configured and disposed so that airflow through the airflow opening passes across the air-to-coolant heat exchanger. The air-to-coolant heat exchanger is configured to extract heat from airflow passing thereacross.

Numerous enhancements to the air-cooling apparatus, including the heat exchanger door, are disclosed herein, including: providing manifold coupled, quick connect couplings within the heat exchanger door at a right angle to vertically-extending coolant inlet and outlet manifolds; providing a door latch mechanism and catch bracket which allows the door latch mechanism to reside entirely within the heat exchanger door; providing an inwardly curved or inwardly angled latch edge on the heat exchanger door, such that the diagonal of the heat exchanger door from the hinge axis to the latch edge is pulled in somewhat; forming the structural door at least partially around the heat exchanger core itself by providing, for example, a beam box integrated with a flange of the heat exchanger core such that heat exchanger core turns reside within the beam box; hinging the heat exchanger door at the outer side of the heat exchanger door, away from the electronics rack to which the heat exchanger door is mounted using, for example, upper and lower hinge brackets, with respective hinge pins extending into the heat exchanger door; designing the heat exchanger door to be symmetrical so that the door can be flipped upside down using the same door latch mechanism position and hinge pins, for example, to allow for coupling of the door to overhead coolant supply and return headers; the use of counter-flow circuits to maximize heat removal from the heat exchanger core, along with numerous heat exchanger core design optimizations and a process for maximizing heat exchanger core design. These and other aspects of the air-cooling apparatus and heat exchanger door described herein, collectively contribute to enlarging the size of the heat exchanger core without changing the overall height or width of the heat exchanger door, and thus to meeting the above-stated goals of maximizing the amount of heat which can be removed from the airstream, while minimizing the air-side pressure drop across the heat exchanger door.

Figure 5A:
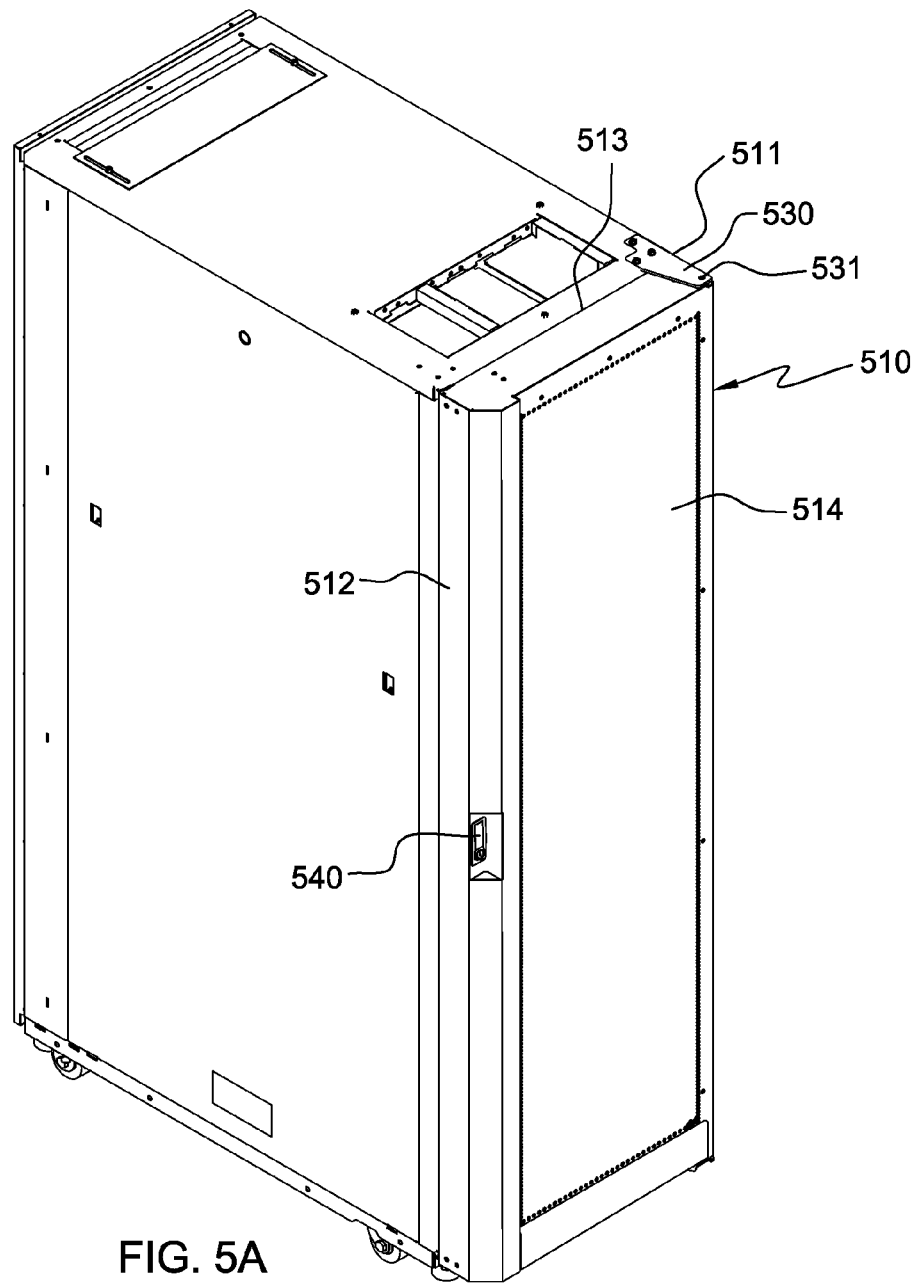
FIG. 5A depicts an electronics rack with an air-cooling apparatus disposed at one of the air outlet side or air inlet side thereof, and with the heat exchanger door shown in a latched position, in accordance with one or more aspects of the present invention.
Figure 5B:
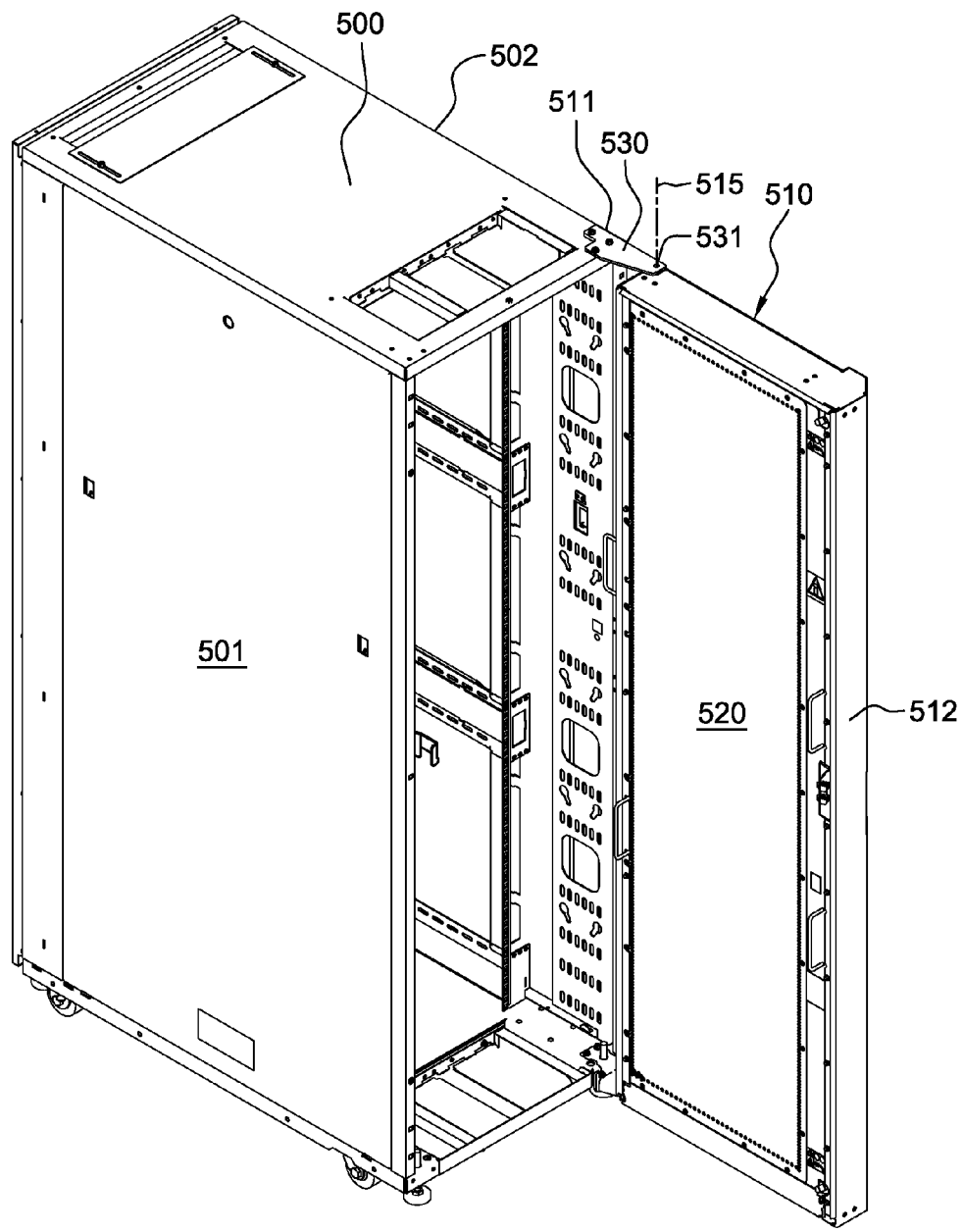
FIG. 5B depicts the electronics rack and air-cooling apparatus of FIG. 5A, with the heat exchanger door shown in an unlatched and open position, in accordance with one or more aspects of the present invention.

FIGS. 5A & 5B depict one embodiment of an assembly comprising a heat exchanger door 510 hingedly mounted at a vertically-extending hinge edge 511 of the heat exchanger door to an electronics rack 500 at, for example, an air outlet side of the electronics rack. Heat exchanger door 510 includes an enlarged air-to-coolant heat exchanger 520 (FIG. 5B) having a larger height and width compared with the air-to-coolant heat exchanger of the outlet door described above in connection with the embodiment of FIG. 4. This is achieved without changing the overall height or width of the door itself, but rather, by reconfiguring the structure of the door and components within the door to accommodate a significantly larger air-to-coolant heat exchanger 520 core footprint. In the embodiment depicted, heat exchanger door 510 includes, in addition to hinge edge 511, a vertically-extending latch edge 512 disposed opposite to hinge edge 511, and an inner side 513 and an outer side 514, which are opposite main sides of the heat exchanger door. In the embodiment depicted, inner side 513 is disposed closer to the air outlet side or air inlet side of electronics rack 500 with heat exchanger door 510 latched to the electronics rack, as illustrated in FIG. 5A. Heat exchanger door 510 mounts, in one embodiment, via top and bottom hinge brackets 530 and hinge pins 531 located at or adjacent to hinge edge 511 of heat exchanger door 510. As illustrated, hinge pins 531 may be positioned close to outer side 514 of heat exchanger door so that the hinge axis 515 is out from the electronics rack to, at least in part, minimize or even eliminate the outward swing of the heat exchanger door past electronics rack sides 501, 502, as heat exchanger door 510 is rotated between open and closed positions. As described further below, a door latch mechanism 540 is disposed (in one embodiment) adjacent to latch edge 512 and is configured to facilitate latching of heat exchanger door 510 to electronics rack 500 when in the closed position (illustrated in FIG. 5A). As noted, perforated screens may be provided at inner side 513 and/or outer side 514 of heat exchanger door 510, if desired.

Figure 6:
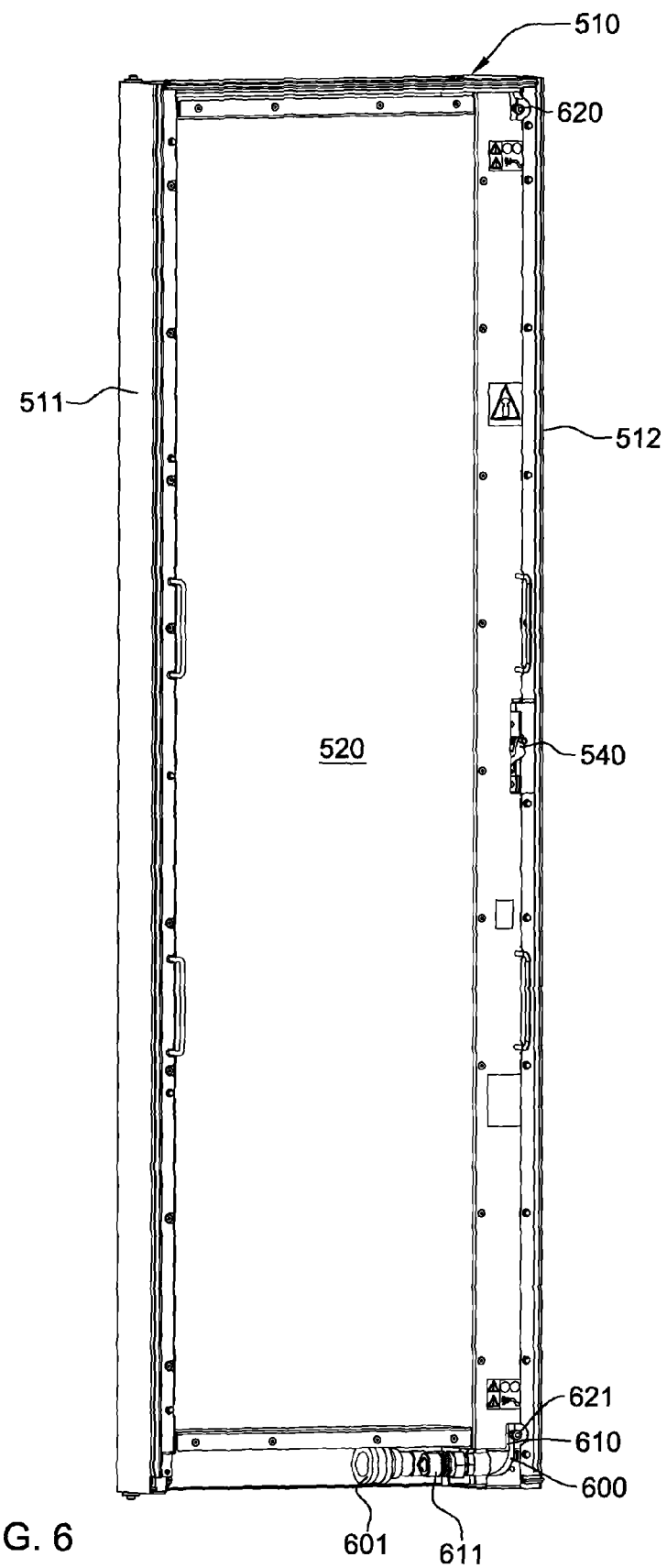
FIG. 6 depicts an inner side, isometric view of one partial embodiment of the heat exchanger door of FIGS. 5A & 5B, in accordance with one or more aspects of the present invention.

FIG. 6 illustrates an inner side, isometric view of a partially assembled heat exchanger door 510, which is shown to include vertically-oriented, coolant inlet and outlet manifolds 600, 610 disposed adjacent to latch edge 512 of the heat exchanger door. In addition, right angle adapters are installed at the ends of the manifolds, with quick connect couplings 601, 611 that facilitate ready attachment of supply and return hoses (not shown) within the bottom of the heat exchanger door to the connects. By way of example, industry standard, hydraulic quick connect couplings may be employed, such as a ¾" quick connect female coupling and a ¾" quick connect male coupling, such as Series-60 general purpose couplings, offered by Parker Hannifin Corporation, of Minneapolis, Minn., USA. The supply and return hoses can pass through bottom openings (not shown) adjacent to the hinge edge 511 of the heat exchanger door, which are configured to accommodate the respective coolant hoses. In one embodiment, the coolant supply and return hoses would connect to coolant supply and return manifolds disposed below a raised floor of the data center, such as described above in connection with FIG. 3.

The heat exchanger core 520 includes a plurality of heat exchange tube sections which couple in fluid communication to coolant inlet manifold 600 and coolant outlet manifold 610. Each heat exchange tube section may includes at least one of a continuous tube or multiple tubes connected together to form, for example, a continuous serpentine cooling channel. In the embodiment shown, each heat exchange tube section may be a continuous tube having a first diameter, and each coolant manifold 600, 610 may be a tube having a second diameter, wherein the second diameter is greater than the first diameter. The first and second diameters are chosen to ensure adequate supply of coolant flow through the multiple heat exchange tube sections. In the embodiment of FIG. 6, the thermally conductive fins attached to the tubes are not illustrated. By way of example, in one embodiment, the plurality of tubes (or tube sections) may extend principally horizontally, and the plurality of thermally conductive fins (not shown) may extend principally vertically.

One or more small air bleed lines and valves 620 may be located at the top of the manifolds. Air bleed tools can be used to capture any exiting coolant during start-up. Another small drain line and valve 621 may be located at a lowest point of the manifold system to facilitate draining the heat exchanger door, if necessary. By way of example, the air bleed valves at the ends of the air bleed lines could comprise Schrader valves, such as those offered by J/B Industries, of Aurora, Ill., USA.

Advantageously, by making a right angle turn from the manifolds, before coupling to the supply and return hoses, horizontally attaching the hoses within the heat exchanger door along the bottom of the heat exchanger door is achieved, which allows the height of the heat exchanger core to come closer to the height of the heat exchanger door itself. This one change may advantageously allow the unusable height of the door for the heat exchanger core to decrease by 50% from, for example, the configuration depicted in FIG. 4.

Figure 7A:
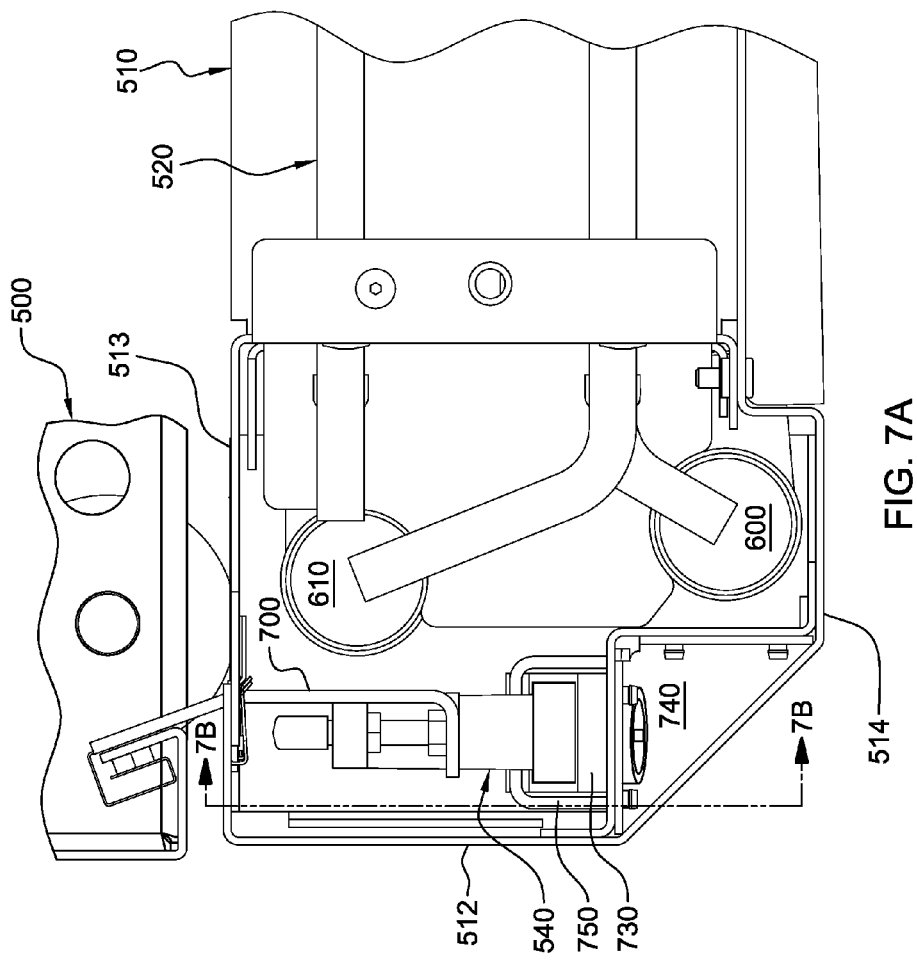
FIG. 7A is a partial cross-sectional plan view of the electronics rack and air-cooling apparatus of FIGS. 5A-6, shown with the heat exchanger door latched to the electronics rack, in accordance with one or more aspects of the present invention.

FIG. 7A is a partial cross-sectional plan view of heat exchanger door 510, and a portion of electronics rack 500, with the heat exchanger door 510 shown in a latched position, secured by door latch mechanism 540 contacting a catch bracket 700. As illustrated, catch bracket 700 is mounted to the electronics rack and sized to extend from the electronics rack into heat exchanger door 510 through a catch opening (not shown) at the inner side 513 of heat exchanger door 510. Note that, in this embodiment, door latch mechanism 540 advantageously resides entirely within the heat exchanger door 510, and that latching to catch bracket 700 occurs within the heat exchanger door itself by the door latch mechanism physically engaging the catch bracket within the door, thereby ensuring latching of the door to the electronics rack. This is contrasted with a conventional rack door latch, which typically extends from the door into the electronics rack in order to engage an element within the electronics rack.

Figure 7C:
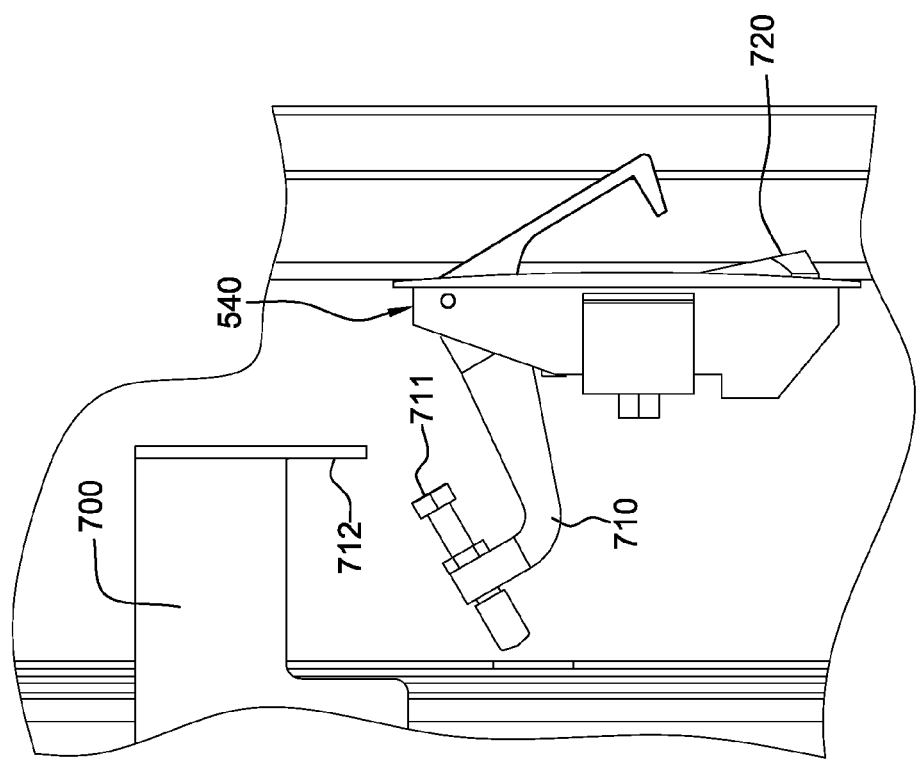
FIG. 7C depicts the partial cross-sectional elevational view of FIG. 7B, with the latch lever unlatched or disengaged from the catch bracket to allow opening of the heat exchanger door, in accordance with one or more aspects of the present invention.
Figure 7B:
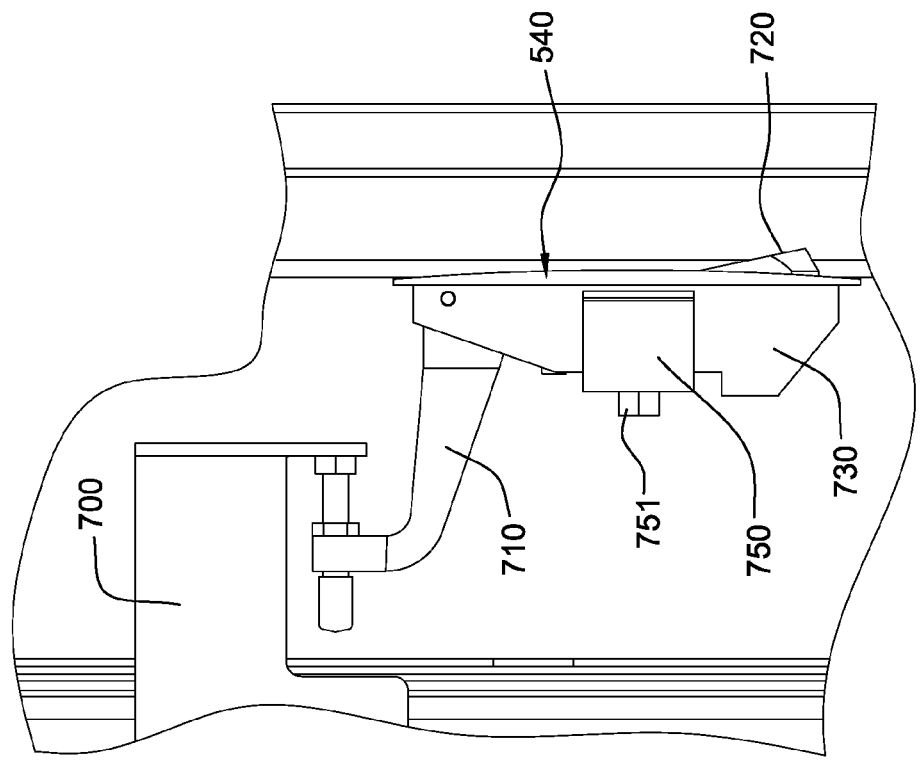
FIG. 7B is a partial cross-sectional elevational view taken along line 7B-7B in FIG. 7A, and shown with the latch lever of the door latch mechanism latched to the catch bracket of the air-cooling apparatus, in accordance with one or more aspects of the present invention.

As illustrated in FIGS. 7B & 7C, door latch mechanism 540 includes a latch lever or arm 710, which as noted resides entirely within heat exchanger door 510. This pivoting latch lever 710 physically engages catch bracket 700 within the heat exchanger door to hold the heat exchanger door in the latched position illustrated in FIGS. 7A & 7B. FIG. 7C illustrates the heat exchanger door closed, but unlatched, whereby an operator has manually actuated a release 720 to release latch lever 710 from physical engagement with catch bracket 700.

Note that in the embodiment of FIGS. 7A-7C, door latch mechanism 540 comprises a base structure 730 mounted to the door frame at or near outer side 514 of the door, for example, so as to reside within a symmetrical recess 740 (FIG. 7A) at latch edge 512 of the heat exchanger door. Latching of heat exchanger door can be accomplished by closing the heat exchanger door against the electronics rack, and actuating by an operator latch lever 710 to move a latch surface 711 of latch lever 710 into physical engagement with a catch surface 712 of catch bracket 700. As noted, this occurs within the heat exchanger door 510.

Note with reference to FIGS. 7A & 7B, that a U-shaped bracket 750 may be employed in mounting base structure 730 of door latch mechanism 540 to a wall of the door frame. In one embodiment, U-shaped bracket 750 may be secured in bracket-receiving channels via an appropriately-sized bolt 751.

Figure 8A:
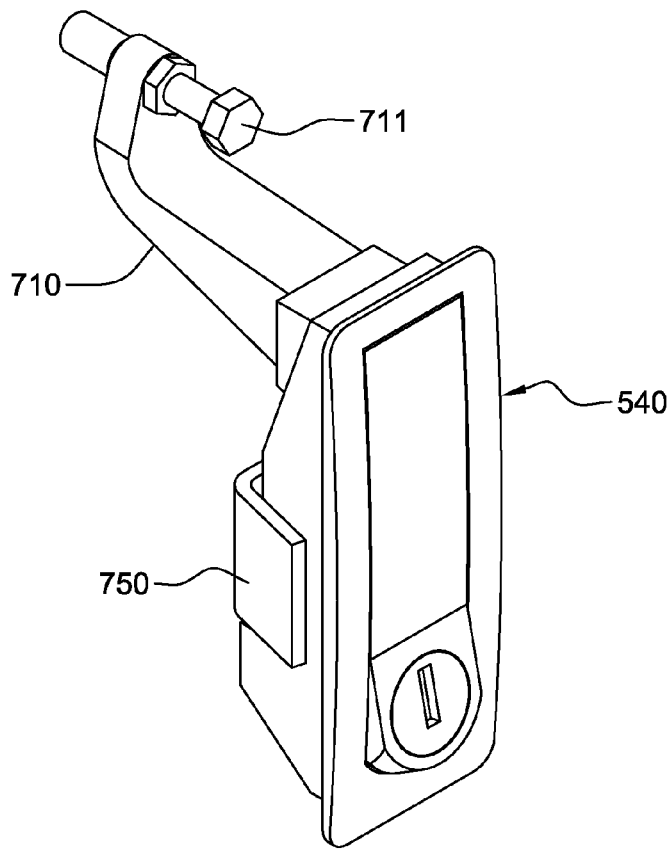
FIG. 8A is a front isometric view of one embodiment of the door latch mechanism of FIGS. 7A-7C, in accordance with one or more aspects of the present invention.
Figure 8B:
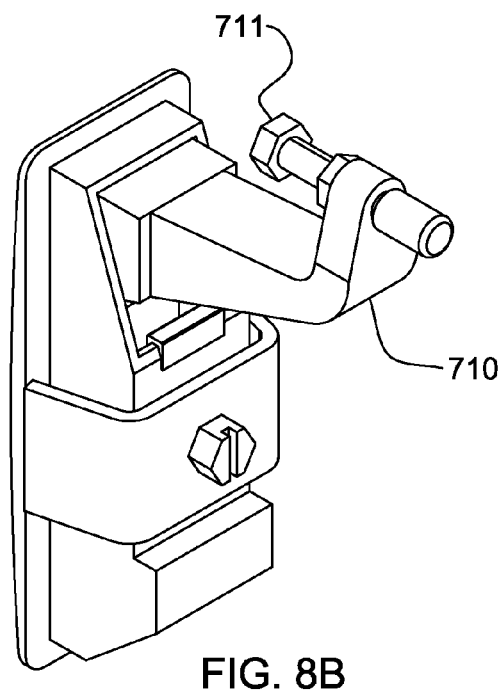
FIG. 8B is a back isometric view of the door latch mechanism of FIG. 8A, in accordance with one or more aspects of the present invention.

FIGS. 8A & 8B depict front and back isometric views of one embodiment of a door latch mechanism, such as described above in connection with FIGS. 7A-7C. In one implementation, door latch mechanism 540 may comprise a lever-type latch, such as offered by Southco, of Concordville, Pa., USA.

Figure 9:
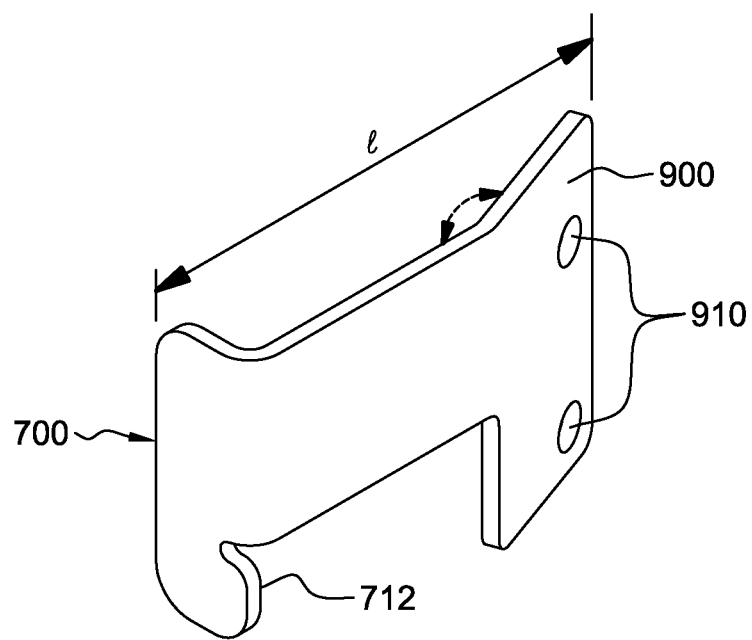
FIG. 9 is an isometric view of one embodiment of the catch bracket of FIGS. 7A-7C of the air-cooling apparatus, in accordance with one or more aspects of the present invention.

FIG. 9 illustrates an isometric view of catch bracket 700 depicted in FIGS. 7A-7C. In one embodiment, catch bracket 700 is fabricated of a one-piece construction, for example, from a rigid material, such as a metal plate. Catch bracket 700 has a length "l" sufficient for catch surface 712 to reside within the heat exchanger door and be positioned for the pivoting latch lever 710, and in particular, latch surface 711 thereof, to engage the catch surface 712 when the latch lever is in the latched position (illustrated, by way of example, in FIGS. 7A & 7B). Catch bracket 700 has a rack-mount portion 900 with, for example, attachment openings 910 which allow for bolting of the rack-mount portion 900, and thus the catch bracket 700, to a corresponding plate (or flange) within the electronics rack, such as illustrated in FIG. 7A. Depending on the orientation of this plate, the angling of the rack-mount portion 900 may change. Note that, in one embodiment, catch surface 712 is oriented substantially parallel to the inner side 513 of heat exchanger door 510, and is thus substantially parallel to the air inlet side and air outlet side of the electronics rack when the heat exchanger door is in latched position.

Advantageously, by providing a catch bracket which extends into the heat exchanger door, and by configuring, sizing and placing the door latch mechanism entirely within the heat exchanger door, the latch mechanism can move towards the latch edge of the heat exchanger door, thereby achieving a goal of expanding the heat exchanger core width. Note that this additional space is achieved by the placement of the door latch mechanism within the door frame and, for example, by configuring the attachment bracket as a U-shaped bracket to closely wrap around the base structure of the door latch mechanism. Also, note that the door latch mechanism disclosed herein is decoupled from the rack flange width. This is significant for both maximizing core width, and adding design flexibility for multiple electronics rack configurations. In the embodiment depicted in FIGS. 7A-7C, the door latch mechanism is not a gate to the heat exchanger core width. In one embodiment, this enables a greater core width, and with an even skinnier latch configuration, would allow for further expansion of the heat exchanger core width. In particular, the door latch mechanism configuration and placement disclosed herein means that the latch itself does not have to cross the plane of the electronics rack, which has certain key advantages, and in particular: the heat exchanger core width can be insensitive to the electronics rack design, by just defining different door catch brackets; and the heat exchanger core width can be maximized, since it is not limited by the electronics rack geometry.

As a further advantage, by providing the catch bracket to extend into the heat exchanger door, and by configuring, sizing and placing the door latch mechanism entirely within the heat exchanger door, the latch mechanism is isolated from any wiring or cabling within the electronics rack that might otherwise be inadvertently engaged by the latch mechanism, and does not constrain cabling space within the electronics rack.

Figure 10:
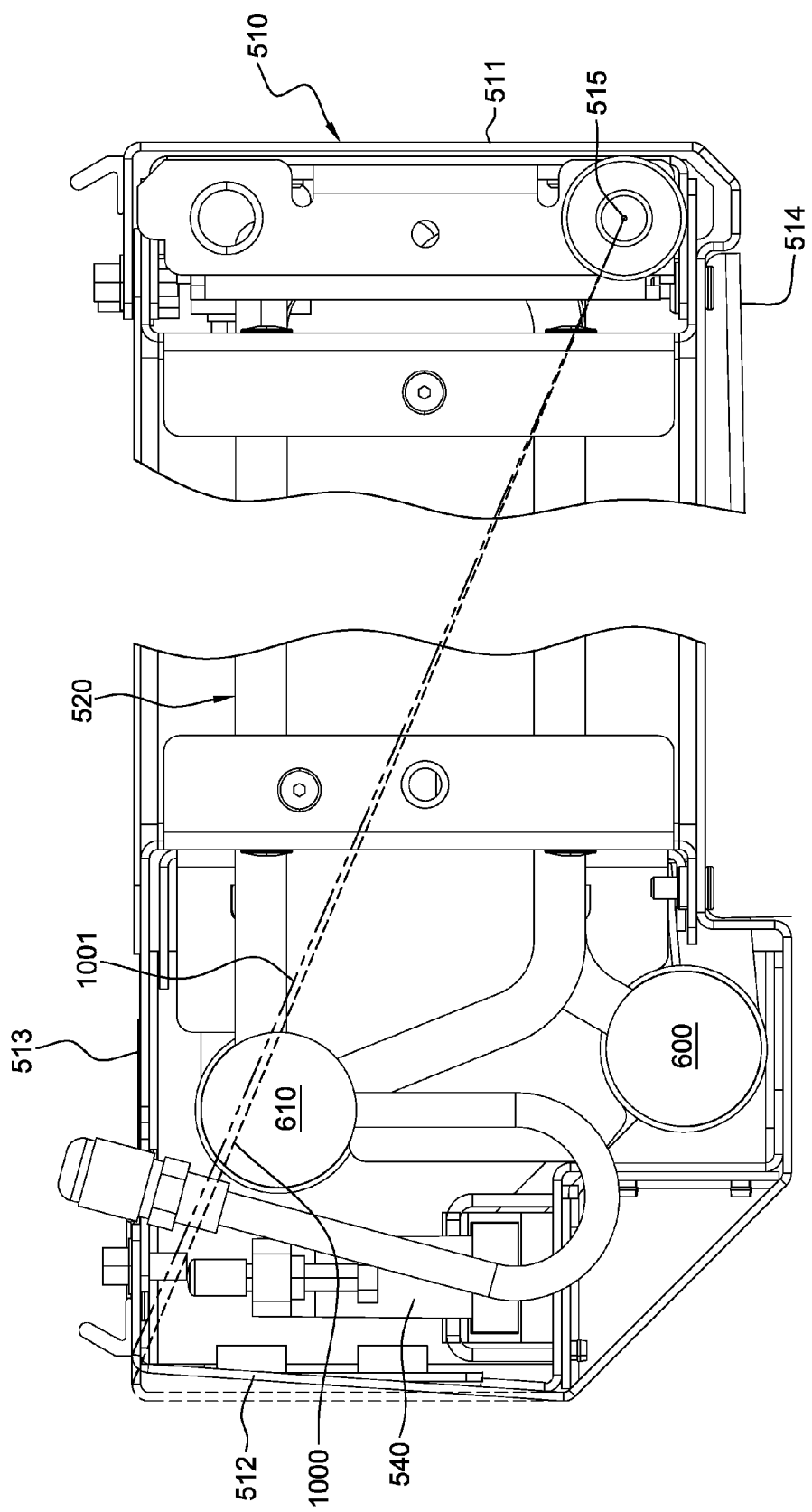
FIG. 10 is a partial cross-sectional plan view of another embodiment of a heat exchanger door, configured with an inward-curved or inward-angled latch edge, in accordance with one or more aspects of the present invention.

Referring to FIG. 10, and as noted above, in another aspect, the hinge axis 515 of heat exchanger door 510 is disposed (in one embodiment) at an outer corner of the heat exchanger door, at the door corner between hinge edge 511 and outer side 514. Hinge brackets 530 (FIG. 5A) may be mounted above and below the electronics rack 500 to facilitate this hinge axis location. This allows for the heat exchanger door to be opened adjacent to, for example, another assembly comprising an electronics rack with a similar heat exchanger door or, for example, for the door to be opened adjacent to a wall of the data center. Advantageously, by moving the door latch mechanism 540 to reside entirely within the heat exchanger door as described herein, additional space is freed at the diagonally-opposite corner of the heat exchanger door 510, that is, at the corner defined by latch edge 512 and the inner side 513 of the heat exchanger door. This allows for the latch edge 512 to either curve inward or angle inward from, for example, outer side 514 towards inner side 513, as illustrated (by way of example) in the cross-sectional plan view of FIG. 10. This advantageously results in a pulling in of the diagonal distance along diagonal line 1000 to that of diagonal line 1001, to gain core width from the refrigerator hinge point.

As a further design advantage, the heat exchanger door described herein with reference to FIGS. 5A-10 may be configured so that the door can be installed upside down to, for example, move the hinge edge from one side of the electronics rack to the other side. This ability to flip the heat exchanger door upside down is achieved using the same door latch mechanism in the same vertical location in the heat exchanger rack. If flipped upside down, the air bleed and drain bleed lines would reverse function, with extra care being taken to bleed air from the heat exchanger core in the upside down version. Note that an extra set of hinge plates might be needed in order to flip the heat exchanger door upside down in order to mount the door to a different side of the electronics rack. Mounting the heat exchanger door upside down as described herein would advantageously place the quick connects for the coolant inlet and outlet manifolds at the top of the heat exchanger door, and thus facilitate coupling of the heat exchanger door to overhead coolant supply and return manifolds, depending upon the configuration of the data center.

The terminology used herein is for the purpose of describing particular embodiments only and is not intended to be limiting of the invention. As used herein, the singular forms "a", "an" and "the" are intended to include the plural forms as well, unless the context clearly indicates otherwise. It will be further understood that the terms "comprise" (and any form of comprise, such as "comprises" and "comprising"), "have" (and any form of have, such as "has" and "having"), "include" (and any form of include, such as "includes" and "including"), and "contain" (and any form contain, such as "contains" and "containing") are open-ended linking verbs. As a result, a method or device that "comprises", "has", "includes" or "contains" one or more steps or elements possesses those one or more steps or elements, but is not limited to possessing only those one or more steps or elements. Likewise, a step of a method or an element of a device that "comprises", "has", "includes" or "contains" one or more features possesses those one or more features, but is not limited to possessing only those one or more features. Furthermore, a device or structure that is configured in a certain way is configured in at least that way, but may also be configured in ways that are not listed.

The corresponding structures, materials, acts, and equivalents of all means or step plus function elements in the claims below, if any, are intended to include any structure, material, or act for performing the function in combination with other claimed elements as specifically claimed. The description of the present invention has been presented for purposes of illustration and description, but is not intended to be exhaustive or limited to the invention in the form disclosed. Many modifications and variations will be apparent to those of ordinary skill in the art without departing from the scope and spirit of the invention. The embodiment was chosen and described in order to explain the principles of the invention and the practical application, and to enable others of ordinary skill in the art to understand the invention through various embodiments and the various modifications thereto which are dependent on the particular use contemplated.

What is claimed is:

1. An apparatus comprising:
   a heat exchanger door configured to hingedly couple to an electronics rack and be disposed at one of an air inlet side or an air outlet side of the electronics rack, wherein air moves through the electronics rack from the air inlet side to the air outlet side thereof, and wherein the heat exchanger door comprises:
   a door frame sized and configured to span at least a portion of the air inlet side or the air outlet side of the electronics rack, the door frame comprising an airflow opening, the airflow opening facilitating the ingress or egress of airflow through the electronics rack with the heat exchanger door mounted thereto;

an air-to-coolant heat exchanger supported by the door frame and disposed so that the airflow through the airflow opening passes across the air-to-coolant heat exchanger, the air-to-coolant heat exchanger configured to extract heat from the airflow passing thereacross;

a door latch mechanism to selectively latch the heat exchanger door to the electronics rack; and a catch bracket configured to attach to the electronics rack and sized to extend from the electronics rack into the heat exchanger door through a catch opening in the heat exchanger door to facilitate latching of the heat exchanger door to the electronics rack, wherein the door latch mechanism is configured to, and mounted within the heat exchanger door to, selectively, physically engage the catch bracket within the heat exchanger door and thereby latch the heat exchanger door to the electronics rack.

2. The apparatus of claim 1, wherein the door latch mechanism comprises a latch lever, the latch lever comprising a latch surface, and wherein responsive to an actuation of the latch lever, the latch lever transitions the latch surface into physical engagement with the catch bracket within the heat exchanger door, and thereby secures the heat exchanger door in the latched position.

3. The apparatus of claim 2, wherein the door latch mechanism further comprises a latch base mounted within the heat exchanger door adjacent to an outer side of the heat exchanger door, and a latch actuator to facilitate operator latching and unlatching of the heat exchanger door to the electronics rack.

4. The apparatus of claim 1, wherein the catch bracket comprises a catch surface engaged by the door latch mechanism within the heat exchanger door to secure the heat exchanger door in a latched position, the catch surface being oriented parallel to the air inlet side or air outlet side of the electronics rack.

5. The apparatus of claim 1, wherein the heat exchanger door further comprises a coolant inlet manifold and a coolant outlet manifold disposed between the door latch mechanism and the air-to-coolant heat exchanger, the coolant inlet manifold and the coolant outlet manifold being coupled to facilitate flow of coolant through the air-to-coolant heat exchanger, and the door latch mechanism being disposed adjacent to a latch edge of the heat exchanger door, the latch edge being an opposite edge of the heat exchanger door from a hinge edge thereof, the hinge edge comprising an edge of the heat exchanger door configured for hinged mounting of the heat exchanger door to the electronics rack at the air inlet side or the air outlet side thereof.

6. The apparatus of claim 5, wherein the coolant inlet manifold and coolant outlet manifold extend vertically within the heat exchanger door, and comprise right angle bends for facilitating coupling to a coolant supply line, and a coolant return line, respectively.

7. The apparatus of claim 5, wherein the latch edge and hinge edge are opposite vertical edges of the heat exchanger door, and the door latch mechanism is elongate in plan view and comprises a length in a direction of a thickness of the heat exchanger door greater than half the thickness of the heat exchanger door.

8. The apparatus of claim 1, wherein the heat exchanger door is one of curved inward or angled inward at a latch edge of the heat exchanger door from an outer side of the heat exchanger door, adjacent to which the door latch mechanism is mounted, to an inner side of the heat exchanger door, closest to the air inlet side or air outlet side of the electronics rack and adjacent to which the heat exchanger door is configured to reside, wherein the inward-curved or inward-angled latch edge reduces swinging of the latch edge beyond a plane of an outer sidewall of the electronics rack with pivoting open or closed of the heat exchanger door.

9. The apparatus of claim 8, wherein the heat exchanger door is hingedly mounted to the electronics rack with a pivot axis disposed adjacent to the outer side of the heat exchanger door and along a hinge edge of the heat exchanger door disposed opposite to the latch edge of the heat exchanger door.

10. An assembly comprising:

an electronics rack, the electronics rack comprising an air inlet side and an air outlet side, wherein air moves through the electronics rack from the air inlet side to the air outlet side thereof;

a heat exchanger door hingedly mounted to the electronics rack at one of the air inlet side or the air outlet side thereof, the heat exchanger door comprising:

a door frame sized and configured to span at least a portion of the air inlet side or the air outlet side of the electronics rack, the door frame comprising an airflow opening, the airflow opening facilitating the ingress or egress of airflow through the electronics rack with the heat exchanger door latched to the electronics rack at the air inlet side or the air outlet side thereof;

an air-to-coolant heat exchanger supported by the door frame and disposed so that the airflow through the airflow opening passes across the air-to-coolant heat exchanger, the air-to-coolant heat exchanger configured to extract heat from the airflow passing thereacross;

a door latch mechanism to selectively latch the heat exchanger door to the electronics rack; and a catch bracket attached to the electronics rack and extending from the electronics rack into the heat exchanger door through a catch opening in the heat exchanger door to facilitate latching of the heat exchanger door to the electronics rack, wherein the door latch mechanism is configured to, and mounted within the heat exchanger door to, physically engage the catch bracket within the heat exchanger door, and thereby latch the heat exchanger door to the electronics rack.

11. The assembly of claim 10, wherein the door latch mechanism comprises a latch lever, the latch lever comprising a latch surface, and wherein responsive to actuation of the latch lever, the latch lever transitions the latch surface into physical engagement with the catch bracket within the heat exchanger door, and thereby secures the heat exchanger door in the latched position.

12. The assembly of claim 11, wherein the door latch mechanism further comprises a latch base mounted within the heat exchanger door adjacent to an outer side of the heat exchanger door, and a latch actuator to facilitate operator latching and unlatching of the heat exchanger door to the electronics rack.

13. The assembly of claim 10, wherein the catch bracket comprises a catch surface engaged by the door latch mechanism within the heat exchanger door to secure the heat exchanger door in a latched position, the catch surface being oriented parallel to the air inlet side or air outlet side of the electronics rack.

14. The assembly of claim 10, wherein the heat exchanger door further comprises a coolant inlet manifold and a coolant outlet manifold disposed between the door latch mechanism and the air-to-coolant heat exchanger, the coolant inlet manifold and the coolant outlet manifold being coupled to facilitate flow of coolant through the air-to-coolant heat exchanger, and the latch door mechanism being disposed adjacent to a latch edge of the heat exchanger door, the latch edge being an opposite edge of the heat exchanger door from a hinge edge thereof, the hinge edge comprising an edge of the heat exchanger door configured for hinged mounting of the heat exchanger door to the electronics rack at the air inlet side or air outlet side thereof.

15. The assembly of claim 14, wherein the coolant inlet manifold and coolant outlet manifold extend vertically within the heat exchanger door, and comprise right angle bends with quick connects at ends thereof for facilitating coupling to a coolant supply line, and a coolant return line, respectively.

16. The assembly of claim 14, wherein the latch edge and hinge edge are opposite vertical edges of the heat exchanger, and the door latch mechanism is elongate in plan view and comprises a length in a direction of a thickness of the heat exchanger door greater than half the thickness of the heat exchanger door.

17. The assembly of claim 10, wherein the heat exchanger door is curved inward or angled inward at a latch edge of the heat exchanger door from an outer side of the heat exchanger door, adjacent to which the door latch mechanism is mounted, to an inner side of the heat exchanger door, closest to the air inlet side or air outlet side of the electronics rack adjacent to which the heat exchanger door is mounted, wherein the inward-curved or inward-angled latch edge reduces swinging of the latch edge beyond a plane of an outer sidewall of the electronics rack with pivoting open or closed of the heat exchanger door.

18. The assembly of claim 17, wherein the heat exchanger door is hingedly mounted to the electronics rack with a pivot axis disposed adjacent to the outer side of the heat exchanger door and along a hinge edge of the heat exchanger door disposed opposite to the latch edge of the heat exchanger door.

* * * * *